United States Patent
Lau et al.

(10) Patent No.: US 10,178,797 B1
(45) Date of Patent: Jan. 8, 2019

(54) SPLIT AIRFLOW COOLING MODULE

(71) Applicant: Microsoft Technology Licensing, LLC, Redmond, WA (US)

(72) Inventors: Michael Lau, Newark, CA (US); Julia Purtell, Menlo Park, CA (US); Jeffrey Mark Reents, Carnation, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/680,723

(22) Filed: Aug. 18, 2017

(51) Int. Cl.
*G06F 1/20* (2006.01)
*H05K 7/20* (2006.01)

(52) U.S. Cl.
CPC .......... *H05K 7/20172* (2013.01); *G06F 1/20* (2013.01); *H05K 7/20145* (2013.01); *H05K 7/20154* (2013.01); *H05K 7/20209* (2013.01); *G06F 1/203* (2013.01); *G06F 1/206* (2013.01)

(58) Field of Classification Search
CPC .......... H05K 7/20172; H05K 7/20136; H05K 7/20145; H05K 7/20154; H05K 7/20209; H05K 1/0203; G06F 1/20; G06F 1/203; G06F 1/206; G06F 2200/201; G06F 2200/203; H01L 2924/0002; H01L 23/467; H01L 23/47; H01L 23/40; F28D 15/033; F28D 1/08; F28D 2021/0029
USPC ......... 361/694, 679.47, 679.48, 697, 679.54, 361/679.55, 690, 703, 709, 696, 720, 361/679.26, 679.46, 679.5; 165/104.33, 165/80.3; 415/176, 213.1; 454/184; 174/16.1, 16.3; 257/720, 722
See application file for complete search history.

(56) References Cited

U.S. PATENT DOCUMENTS

| | | | |
|---|---|---|---|
| 7,508,664 B2 | 3/2009 | Holland | |
| 7,764,493 B2 | 7/2010 | Ali et al. | |
| 8,405,997 B2 * | 3/2013 | Fujiwara | G06F 1/203 165/80.2 |
| 8,854,814 B2 | 10/2014 | Liu et al. | |
| 8,885,341 B2 | 11/2014 | Desmarets | |
| 9,215,831 B2 | 12/2015 | Hao et al. | |
| 2008/0019827 A1 * | 1/2008 | Hirata | F04D 29/4226 415/206 |
| 2009/0227197 A1 | 9/2009 | Lewis, II et al. | |
| 2010/0315778 A1 | 12/2010 | Yu et al. | |
| 2011/0096498 A1 | 4/2011 | Tambe | |

OTHER PUBLICATIONS

"QFX5110 Cooling System and Airflow", Published Online in Juniper TechLibrary, Jun. 7, 2017, 5 Pages.

* cited by examiner

*Primary Examiner* — Dion R Ferguson
*Assistant Examiner* — Mandeep S Buttar
(74) *Attorney, Agent, or Firm* — Alleman Hall Creasman & Tuttle LLP (57) ABSTRACT

Examples are disclosed that relate to cooling multiple heat-generating components in an electronic device. One example provides a cooling module including an airflow channel downstream of a blower to receive a flow of air generated by the blower, a heat sink extending into the airflow channel and configured to direct air toward a first outlet, and an air-diverting structure positioned within a gap between a distal surface of the heat sink and an opposing interior surface of the airflow channel, the air-diverting structure configured to redirect air flowing in the gap toward a second outlet.

19 Claims, 7 Drawing Sheets

SPLIT AIRFLOW COOLING MODULE

BACKGROUND

Electronic devices may include multiple heat-generating components, such as logic circuitry and power supplies, contained within a common housing. Passive or active cooling strategies may be employed to cool such components.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to cooling multiple heat-generating components in an electronic device. One example provides a cooling module for an electronic device, the cooling module comprising a blower configured to generate a flow of air, an airflow channel downstream of the blower to receive the flow of air from the blower, a heat sink extending into the airflow channel, the heat sink configured to direct air toward a first outlet, a gap between a distal surface of the heat sink and an opposing interior surface of the airflow channel, and an air-diverting structure positioned in the gap, the air-diverting structure configured to redirect air flowing in the gap toward a second outlet.

DETAILED DESCRIPTION

Electronic devices may utilize passive or active cooling systems to cool heat-generating components. A passive cooling system for a heat-generating component may comprise a heat sink in thermal communication with the heat-generating electronic component to transfer heat generated by the device component away from the device component. An active cooling system may further include a forced-air system comprising a fan positioned to blow air across the component and/or heat sink. A forced-air system may help to cool heat-generating components more effectively than a passive system.

However, cooling multiple heat-generating components within a device using a forced air system may pose challenges. For example, where a forced air system includes a single outlet for cooling both a primary and a secondary heat generating component (e.g. a processing system and a power supply), the secondary heat-generating component may receive insufficient cooling. A forced-air system also may include a fan positioned in a housing having an air flow divider oriented parallel to an axis of rotation of the fan, such that a first portion of the airflow is directed towards a primary heat-generating component and a second portion of the airflow is directed towards a secondary heat-generating component. However, such a divider may cause an undesired magnitude of pressure drop in one or both airflows, which may impede device cooling.

Accordingly, examples are disclosed herein that relate to a cooling module for cooling multiple heat-generating components in an electronic device. The disclosed examples are configured to direct a first portion of airflow towards a first outlet and a second portion of airflow towards a second outlet in a manner that may avoid the above-described issues with dividers positioned parallel to an axis of rotation of a fan. Briefly, the disclosed examples provide an airflow channel downstream of the blower to receive the flow of air from the blower, a heat sink extending into the airflow channel and configured to direct air toward a first outlet, and an air-diverting structure positioned within a gap between a distal surface of the heat sink and an opposing interior surface of the airflow channel, the air-diverting structure configured to redirect air flowing in the gap toward a second outlet. Such a cooling module may help to maintain desired airflow pressures at the primary and secondary outlets compared to designs that divide flows along a direction parallel to an axis of rotation of a fan.

Figure 1:
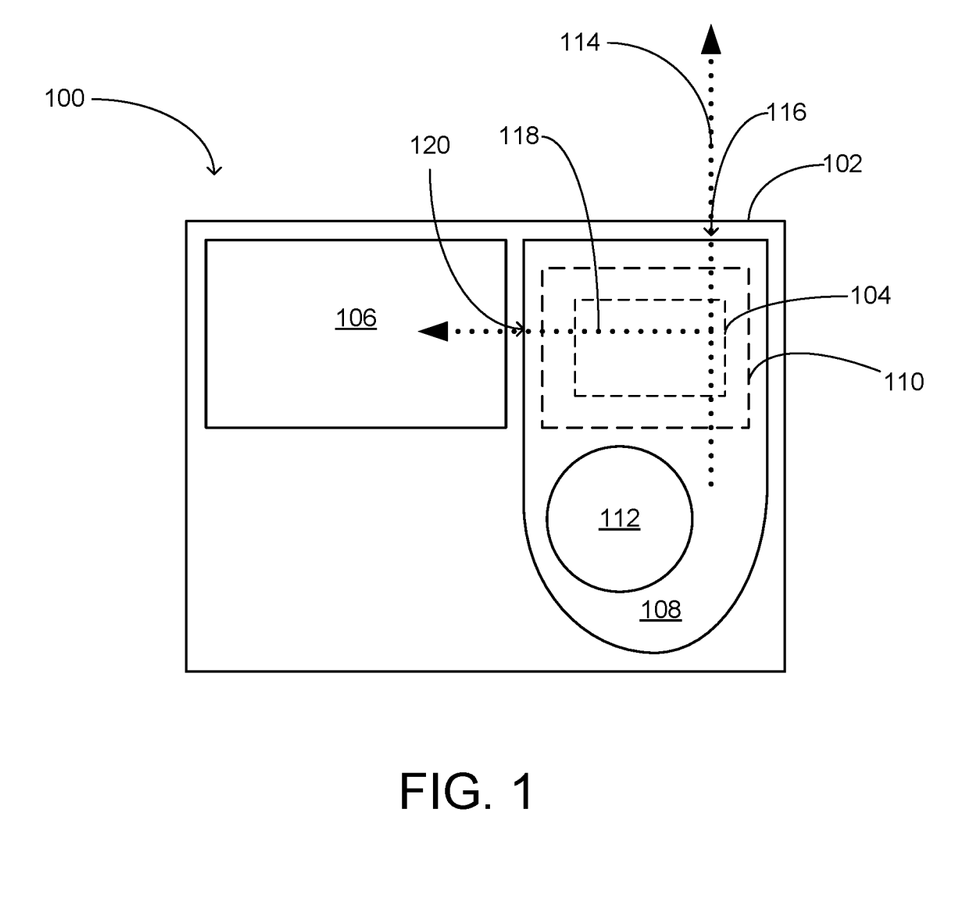
FIG. 1 schematically shows an example electronic device.

FIG. 1 shows a block diagram of an example electronic device 100. Electronic device 100 may represent any suitable type of device, including but not limited to game consoles, laptop computers, desktop computers, and all-in-one computers. Electronic device 100 comprises a housing 102, a first heat-generating component 104, a second heat-generating component 106, and a cooling module 108. Housing 102 may comprise one or more perforations, holes, and/or openings to facilitate airflow into and out of electronic device 100.

First heat-generating component 106 and second heat-generating component 108 each may represent any suitable components. Examples include, but are not limited to, system-on-a-chip (SoC) components, processors and other logic circuitry, and power supply circuitry.

Cooling module 108 comprises a heat sink 110 in thermal communication with a first heat generating component 104 to transfer heat from first heat-generating component 104, and a blower 112 configured to generate a flow of air. As described in more detail below, heat sink 110 includes a plurality of heat exchange structures, such as fins, configured to direct a first portion of airflow 114 generated by blower 112 towards a first outlet 116. Further, cooling module 108 includes a gap between a distal surface of the heat sink (e.g. distal ends of fins with respect to first heat-generating component) and an opposing interior surface of an airflow channel, and an air-diverting structure positioned within the gap to direct a second portion 118 of the airflow from blower 112 through a second outlet 120 toward second heat-generating component 106.

Figure 2:
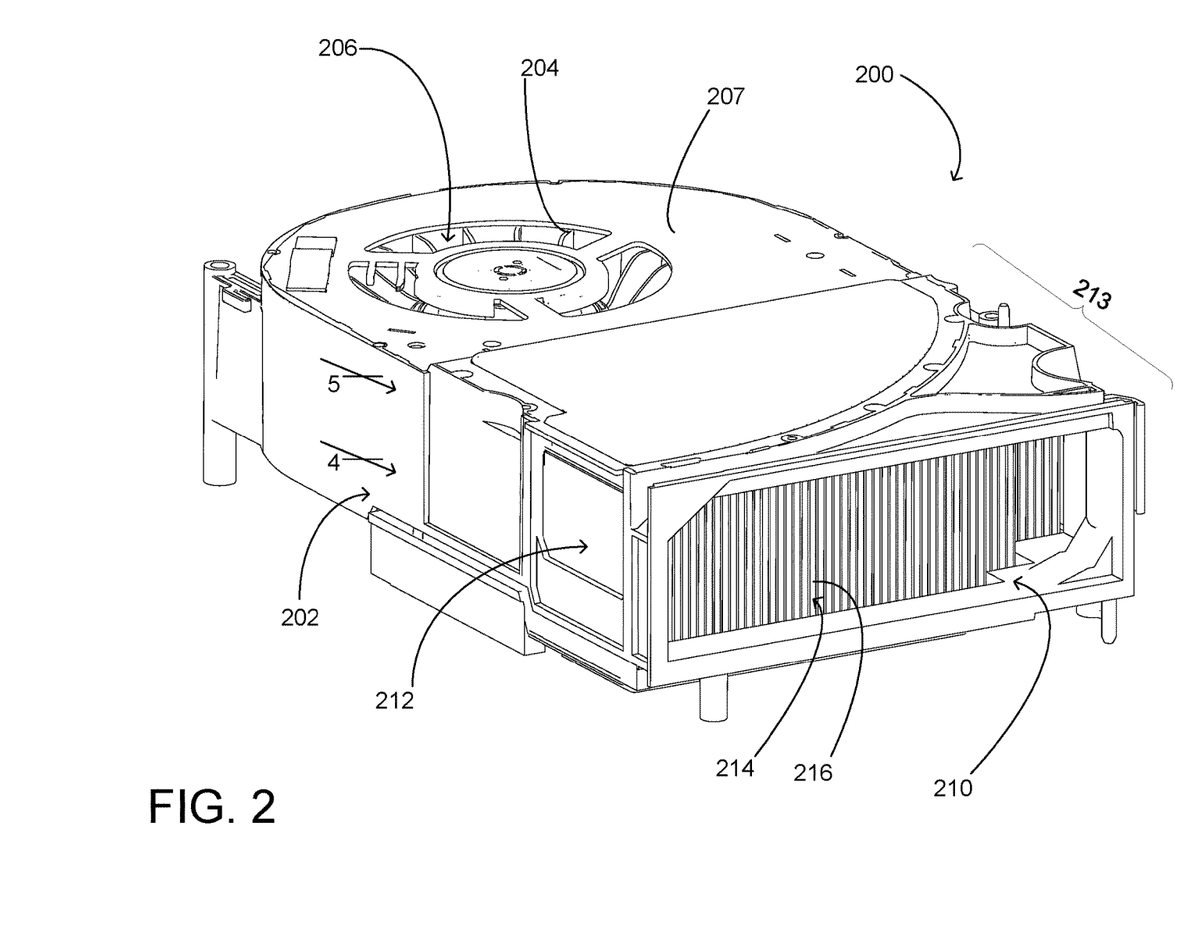
FIG. 2 shows a first perspective view of an example cooling module.
Figure 3:
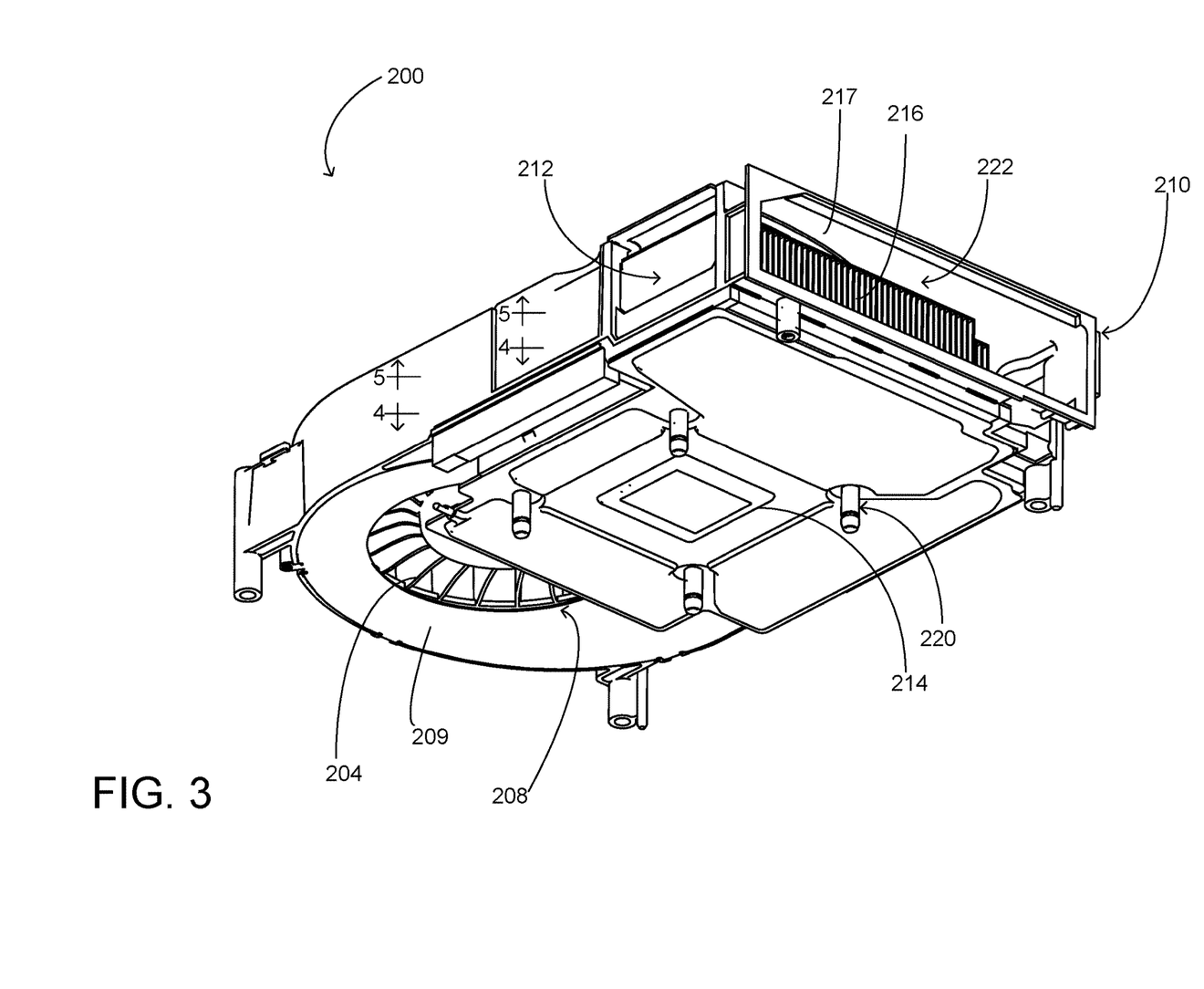
FIG. 3 shows a second perspective view of the example cooling module of FIG. 2.

FIGS. 2-3 show perspective views of an example cooling module 200 configured to cool multiple heat-generating components in an electronic device. Cooling module 200 may be used as cooling module 100 of FIG. 1, for example. Cooling module 200 comprises a body 202, a blower 204 positioned within the body 202, and one or more inlets formed in body 202, examples of which are shown in FIG. 2 as a first inlet 206 on a first side 207 of body 202 and in FIG. 3 as a second inlet 208 on a second side 209 of body 202. In this example, blower 204 comprises a radial fan, but may comprise an axial fan in other examples.

Cooling module 200 further includes an airflow channel 213 positioned downstream of blower 204 to direct airflow from blower 204. Airflow channel 213 comprises a first outlet 210 and a second outlet 212. First outlet 210 is configured to discharge air used to cool heat sink 214 in the airflow channel 213, and second outlet 212 is configured to direct a flow of cooling air toward a second heat-producing component. First outlet 210 and second outlet 212 are each depicted as being rectangular and orthogonal to one another, but may have any other suitable shape and/or orientations in other examples. Likewise, in the depicted example, first outlet 210 has a larger cross-sectional area than second outlet 212, but may have different relative cross-sectional areas in other examples.

Heat sink 214 comprises a plurality of fins 216 extending into the airflow channel 213. Fins 216 are configured to provide a sufficiently large surface area for heat transfer, and also to direct a first portion of airflow generated by blower 204 towards first outlet 210. For example, fins 216 may be arranged in parallel in a direction that extends from an upstream end closer to blower 204 toward a downstream end closer to first outlet 210. Fins 216 may be formed from any suitable thermally conductive material, such as aluminum or an aluminum alloy.

Figure 4:
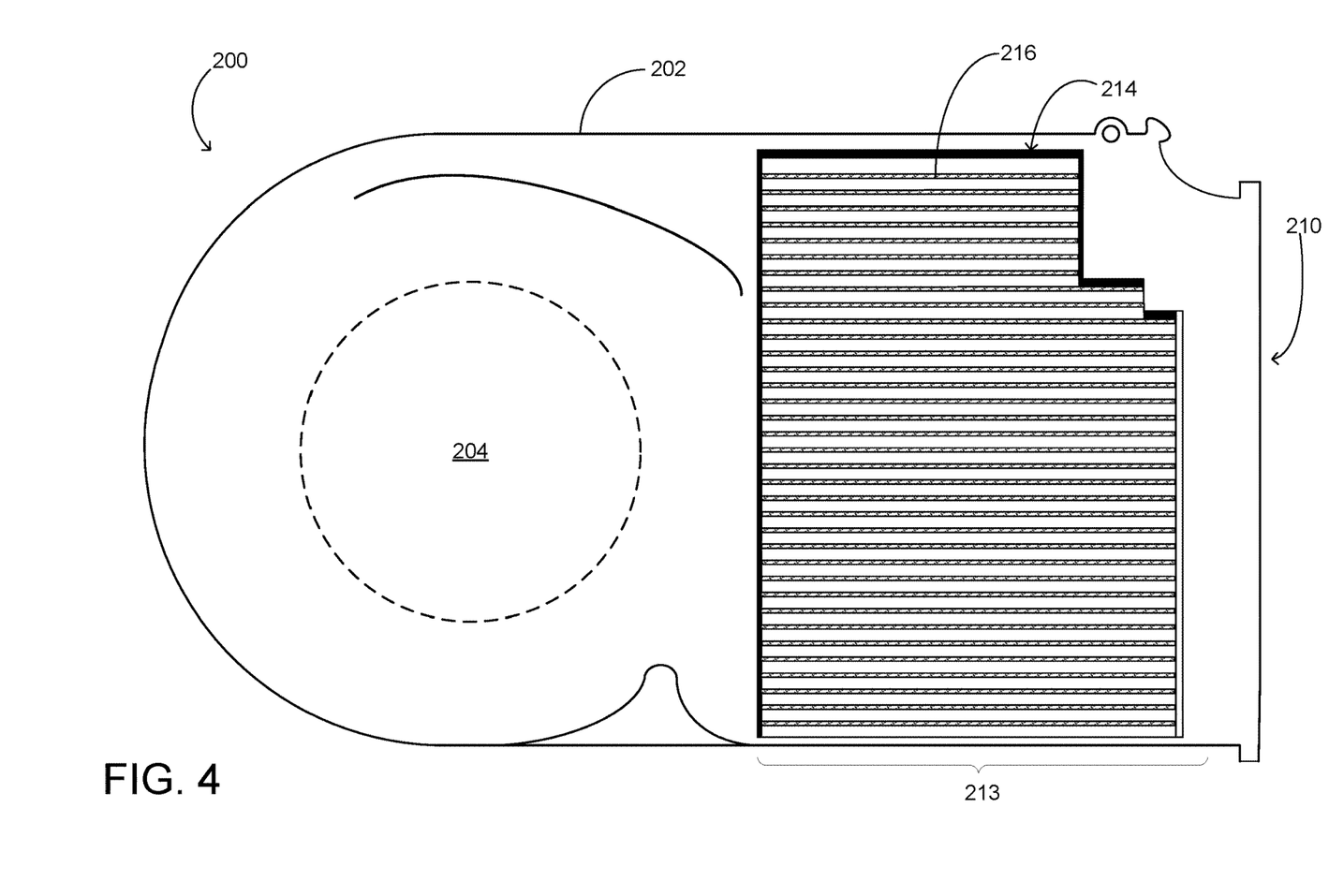
FIG. 4 schematically shows a first cross-sectional view of the example cooling module of FIG. 2, and illustrates a heat sink in an airflow channel.

As mentioned above, fins 216 are configured to extend a partial depth of airflow channel 213, thereby defining a gap between the distal end of fins 216 and an opposing interior surface (217 in FIG. 3) of airflow channel 213. FIG. 4 schematically shows a first cross-sectional view of cooling module 200 taken at line 4-4 of FIGS. 2-3. In this cross-section, fins 216 are shown as being aligned to direct airflow from the blower 204 toward the first outlet 210.

Figure 5:
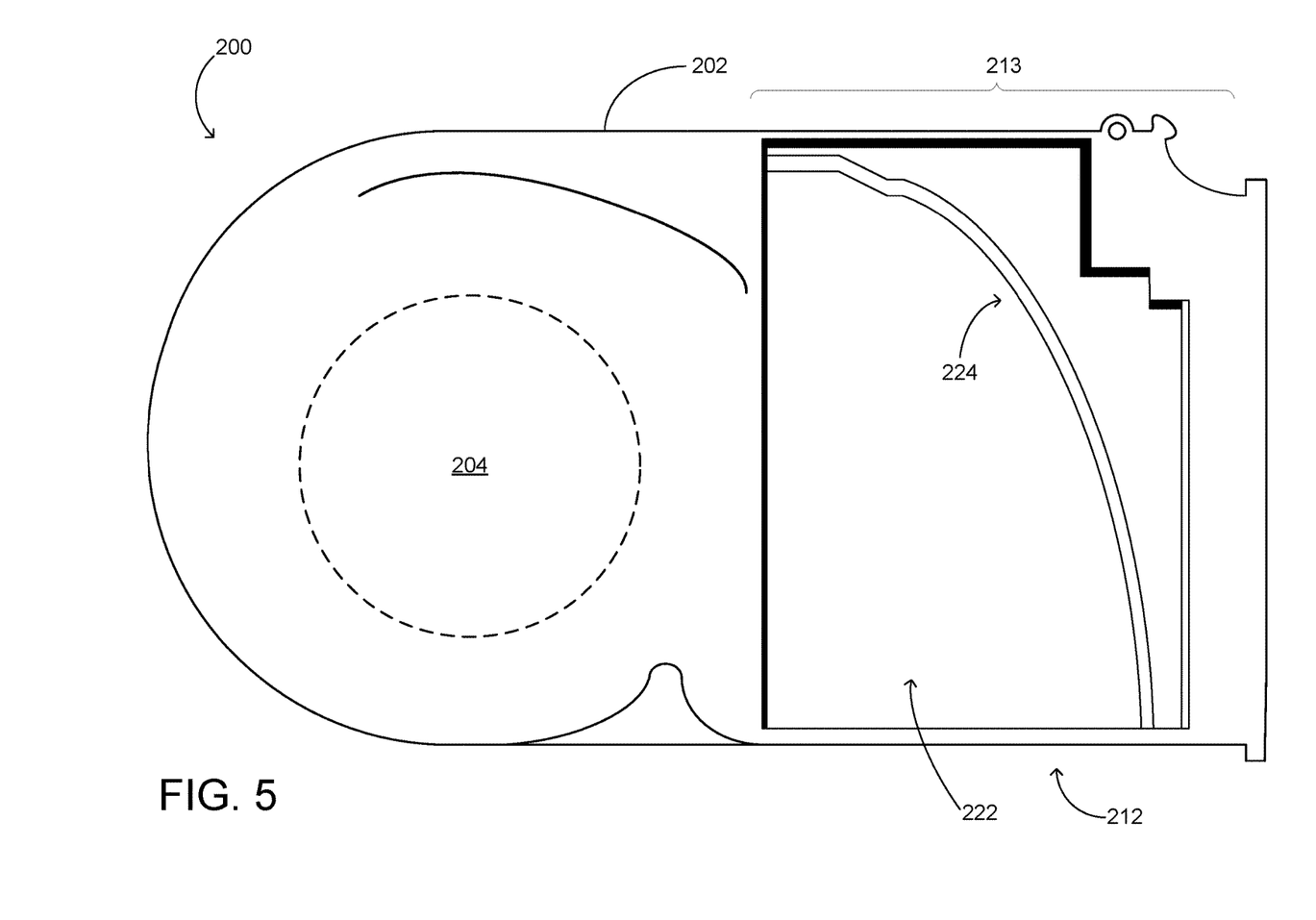
FIG. 5 schematically shows a second cross-sectional view of the example cooling module of FIG. 2, and illustrates an air-diverting structure positioned within a gap in the airflow channel between the heat sink and an opposing surface.

FIG. 5 schematically shows a second cross-sectional view of cooling module 200 taken at line 5-5 of FIGS. 2-3, and shows an absence of fins 216 at this location in the airflow channel, thereby illustrating gap 222. Further, FIG. 5 also shows an air-diverting structure 224 positioned within gap 222. Air-diverting structure 224 is configured to redirect air flowing in gap 222 through second outlet 212 and towards a second heat-generating component. The depicted example air-diverting structure 224 comprises a curved wall extending a partial depth into gap 222, but also may extend a full depth of the gap in other examples. Further, in some examples, air-diverting structure 224 may extend into the gap from an interior surface of body 202 opposing a distal surface of the heat sink, such as an interior surface 217 as shown in FIG. 3. In other examples, an air-diverting structure may extend from a distal surface of the heat sink into the gap. Further, in other examples, air-diverting structure 224 may comprise a plurality of walls configured to redirect airflow through the second outlet, which may extend from either or both of the distal surface of heat sink 214 and the opposing interior surface of airflow channel 213.

In the depicted example, gap 222 is formed between a distal end of the heat sink fins 216 and an opposing interior surface 217 of airflow channel 213. In other examples, cooling module 200 may comprise a wall within airflow channel 213 to separate the airflow channel into a first portion containing the heat sink and a second portion containing the air-diverting structure. When included, such a wall may be either in contact with or spaced from the distal surface of the heat sink (e.g. the distal ends of the heat sink fins) and extend in a plane transverse to an axis of rotation of blower 204, rather than parallel to the axis of rotation. In such an example, it is noted that a gap would be similarly located between the distal surface of the heat sink and the opposing interior surface of the airflow channel.

The shapes and placements of fins 216, gap 222, and air-diverting structure 224 may be configured based upon proportions of air to be directed out the first outlet 210 and second outlet 212. For example, where a first heat-generating component generates more heat during operation of an electronic device than a second heat-generating component and/or the first heat-generating component has higher sensitivity to elevated temperatures, a cooling module may be configured to direct a greater volume of airflow for cooling the first heat-generating component than the second heat-generating component. In a more specific example, air-diverting structure 224 may be configured to direct 5-10% of a volume of the flow of air generated by blower 204 towards the second outlet. The use of an air-diverting structure 224 with a greater depth in the airflow channel may direct a larger portion of airflow through the second outlet towards the second heat-generating component than the use of an air-diverting structure with a lesser depth. In this way, the size and/or shape of components within a cooling module may be varied (e.g. during an optimization process) without modifying an overall shape and size of the cooling module and/or the device. Air-diverting structure 224 may be integrally molded with body 202 in some examples, and attached to an interior location of the cooling module 200 after forming body 202 in other examples.

Figure 6:
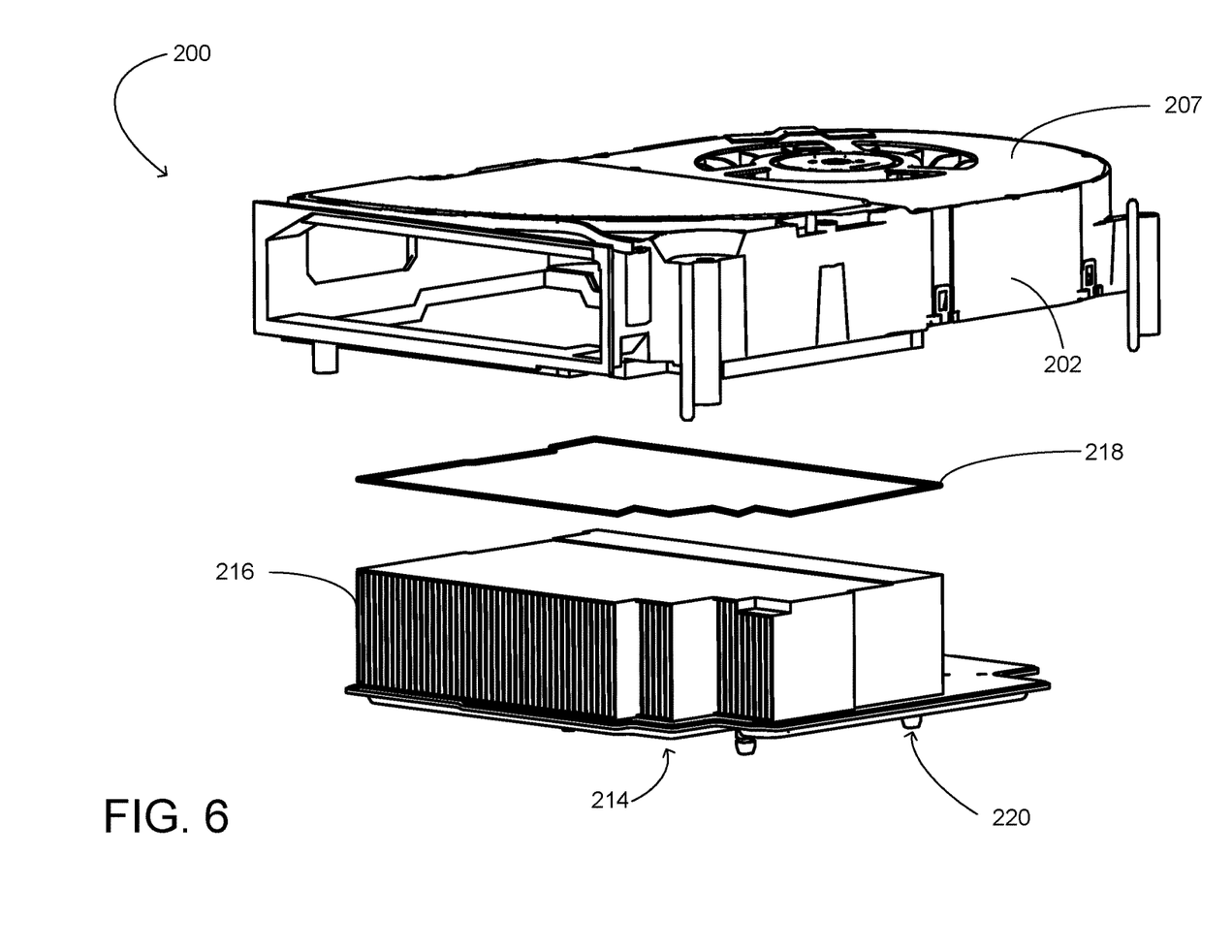
FIG. 6 shows an exploded view of the example cooling module of FIG. 2.

The formation of a sufficiently airtight seal between heat sink 214 and body 202 of cooling module 200 may help to prevent cooling air from leaking out of airflow channel 213, which may impact a cooling efficiency of cooling module 200. Thus, a suitable gasket may be used to seal this interface. FIG. 6 shows an exploded view of cooling module 200 in which a gasket 218 is positioned to seal a space around a perimeter of fins 216 between the heat sink 214 and the body 202 of blower 204. The gasket may comprise a compliant material, such as an elastomer or other suitable polymer material, to allow movement of the heat sink relative to the body of the blower. For example, gasket 218 may comprise one or more of a silicone, polyurethane, metallic fabric-urethane foam hybrid, and polyimide material or materials. The use of a compliant gasket material may allow some float to occur between the position of heat sink 214 and body 202 of cooling module 200, and thus may help to accommodate manufacturing tolerances regarding the location of fasteners 220 used to attach cooling module 200 to a component to which heat sink 214 is mounted and the location of complementary features on the component.

Figure 7:
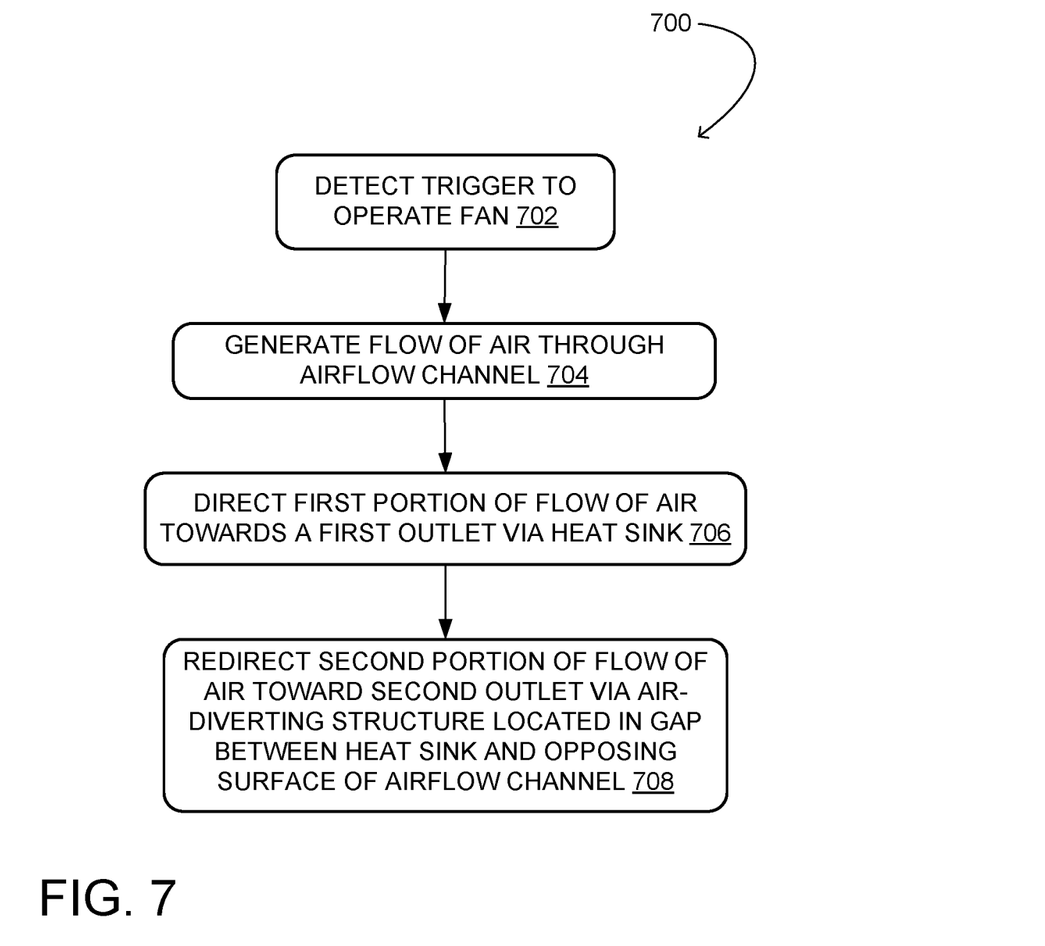
FIG. 7 shows a flow diagram illustrating an example method of cooling an electronic device.

FIG. 7 depicts an example method 700 of cooling an electronic device. Method 700 may be implemented via any suitable hardware, such as that shown in the examples of FIGS. 1-6. At 702, method 700 comprises detecting a trigger to start fan operation. The trigger may comprise any suitable event, such as a device being powered on or a temperature of a first or second heat-producing component exceeding a threshold. The trigger may be detected, for example, by a cooling module controller of the electronic device. Such a controller may comprise a logic subsystem configured to execute instructions, and a data-holding subsystem configured to hold instructions executable by such logic subsystem to perform tasks related to monitoring temperature of one or more heat-generating components via one or more sensors and/or regulating power of the cooling module.

Method 700 further comprises, at 704, generating a flow of air through an airflow channel in the cooling module via a blower. In some examples, the airflow channel may comprise a heat sink extending into the airflow channel, wherein the heat sink is in thermal communication with the first heat-generating component. The blower may operate radially or axially.

At 706, method 700 comprises directing a first portion of the flow of air in the airflow channel through a plurality of fins of the heat sink toward a first outlet to cool the surface of the heat sink. In this example, the first portion of air is directed towards a first outlet by the fins of the heat sink to exit the cooling module. In other examples, the first heat-generating component and/or associated heat sink may be positioned downstream of the first outlet, rather than in the airflow channel. In such an example, the first portion of the flow of air in the airflow channel may be directed towards the first outlet by another structure other than fins of a heat sink, such as by a wall oriented transverse to an axis of rotation of the blower that extends across the airflow channel.

Method 700 further comprises, at 708, directing a second portion of the flow of air in the airflow channel through a gap between a distal surface of the heat sink and an opposing interior surface of the body of the blower such that the second portion of air is redirected through a second outlet via an air-diverting structure in the gap. In some examples, as described above, this may comprise directing the second portion of the flow of air in the airflow channel toward a curved wall extending into the gap. In other examples, any other suitable air-diverting structure may be used than a curved wall.

In this manner, a single blower may be used to cool multiple components in a manner that may preserve a desired velocity and/or pressure of airflow exiting the second outlet compared to a system in which an airflow channel is divided along a plane parallel to an axis of rotation of a blower.

Another example provides a cooling module for an electronic device, the cooling module comprising a blower configured to generate a flow of air, an airflow channel downstream of the blower to receive the flow of air from the blower, a heat sink extending into the airflow channel, the heat sink configured to direct air toward a first outlet, a gap between a distal surface of the heat sink and an opposing interior surface of the airflow channel, and an air-diverting structure positioned in the gap, the air-diverting structure configured to redirect air flowing in the gap toward a second outlet. In such an example, the heat sink may additionally or alternatively comprise a plurality of fins extending into the airflow channel. In such an example, the blower may additionally or alternatively comprise a radial fan. In such an example, the air-diverting structure may additionally or alternatively comprise a curved wall extending into the gap. In such an example, the curved wall may additionally or alternatively extend a partial depth of the gap. In such an example, the air-diverting structure may additionally or alternatively comprise a plurality of walls. In such an example, the cooling module may additionally or alternatively comprise a gasket connecting the heat sink to a body of the blower, the gasket configured to seal a space between the heat sink and the blower while allowing movement of the heat sink relative to the body of the blower. In such an example, the cooling module may additionally or alternatively comprise a wall separating the airflow channel into a first portion containing the heat sink and a second portion containing the air-diverting structure. In such an example, the air-diverting structure may additionally or alternatively extend into the gap from the opposing interior surface. In such an example, the air-diverting structure may additionally or alternatively be coupled to the distal surface of the heat sink.

Another example provides an electronic device, comprising a first heat-generating component, a second heat-generating component, and a cooling module configured to cool the first heat-generating component and the second heat-generating component, the cooling module comprising a blower configured to generate a flow of air, an airflow channel downstream of the blower to receive the flow of air from the blower, a heat sink in thermal communication with the first heat-generating component, the heat sink comprising a plurality of fins extending into the airflow channel, the plurality of fins configured to direct air toward a first outlet, a gap between a distal surface of the plurality of fins of the heat sink and an opposing interior surface of the airflow channel, and an air-diverting structure extending into the gap, the air-diverting structure being configured to redirect air flowing in the gap through a second outlet toward the second heat-generating component. In such an example, the first heat-generating component may additionally or alternatively comprise a processor and the second heat-generating component may additionally or alternatively comprise a power supply. In such an example, the electronic device may additionally or alternatively comprise one or more of a game console, a personal computer, and a laptop computer. In such an example, the electronic device may additionally or alternatively comprise a gasket connecting the heat sink to a body of the blower, the gasket configured to seal a space between the heat sink and the blower while allowing movement of the heat sink relative to the body. In such an example, the air-diverting structure may additionally or alternatively comprise a curved wall. In such an example, the air-diverting structure may additionally or alternatively extend into the gap from the opposing interior surface. In such an example, the air-diverting structure may additionally or alternatively extend a partial depth of the gap.

Another example provides a method of cooling an electronic device with a cooling module, the electronic device comprising a first heat-generating component and a second heat-generating component, the method comprising, in the cooling module, generating a flow of air through an airflow channel via a blower, the airflow channel comprising a heat sink extending into the airflow channel, the heat sink being in thermal communication with the first heat-generating component, directing a first portion of the flow of air in the airflow channel through a plurality of fins of the heat sink toward a first outlet, and directing a second portion of the flow of air in the airflow channel through a gap between a distal surface of the heat sink and an opposing interior surface of a body such that the second portion of the flow of air is redirected toward a second outlet via an air-diverting structure in the gap. In such an example, directing the second portion of the flow of air in the airflow channel through the gap may additionally or alternatively comprise directing the second portion toward a curved wall of the air-diverting structure. In such an example, directing the second portion of the flow of air in the airflow channel may additionally or alternatively comprise redirecting the second portion of the flow of air in a direction transverse to the first portion.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A cooling module for an electronic device, the cooling module comprising: a blower configured to generate a flow of air; an airflow channel downstream of the blower to receive the flow of air from the blower; a heat sink extending into the airflow channel, the heat sink configured to direct air toward a first outlet; a gap between a distal surface of the heat sink and an opposing interior surface of the airflow channel; an air-diverting structure positioned in the gap, the air-diverting structure configured to redirect air flowing in the gap toward a second outlet; and a gasket connecting the heat sink to a body of the blower, the gasket configured to seal a space between the heat sink and the blower while allowing movement of the heat sink relative to the body of the blower.

2. The cooling module of claim 1, wherein the heat sink comprises a plurality of fins extending into the airflow channel.

3. The cooling module of claim 1, wherein the blower comprises a radial fan.

4. The cooling module of claim 1, wherein the air-diverting structure comprises a curved wall extending into the gap.

5. The cooling module of claim 4, wherein the curved wall extends a partial depth of the gap.

6. The cooling module of claim 1, wherein the air-diverting structure comprises a plurality of walls.

7. The cooling module of claim 1, further comprising a wall separating the airflow channel into a first portion containing the heat sink and a second portion containing the air-diverting structure.

8. The cooling module of claim 1, wherein the air-diverting structure extends into the gap from the opposing interior surface.

9. The cooling module of claim 1, wherein the air-diverting structure is coupled to the distal surface of the heat sink.

10. An electronic device, comprising: a first heat-generating component; a second heat-generating component; and a cooling module configured to cool the first heat-generating component and the second heat-generating component, the cooling module comprising a blower configured to generate a flow of air an airflow channel downstream of the blower to receive the flow of air from the blower, a heat sink in thermal communication with the first heat-generating component, the heat sink comprising a plurality of fins extending into the airflow channel, the plurality of fins configured to direct air toward a first outlet; a gap between a distal surface of the plurality of fins of the heat sink and an opposing interior surface of the airflow channel; an air-diverting structure extending into the gap, the air-diverting structure being configured to redirect air flowing in the gap through a second outlet toward the second heat-generating component; and a gasket connecting the heat sink to a body of the blower, the gasket configured to seal a space between the heat sink and the blower while allowing movement of the heat sink relative to the body of the blower.

11. The electronic device of claim 10, wherein the first heat-generating component comprises a processor and the second heat-generating component comprises a power supply.

12. The electronic device of claim 10, wherein the electronic device comprises one or more of a game console, a personal computer, and a laptop computer.

13. The electronic device of claim 10, wherein the gasket comprises a compliant foam.

14. The electronic device of claim 10, wherein the air-diverting structure comprises a curved wall.

15. The electronic device of claim 10, wherein the air-diverting structure extends into the gap from the opposing interior surface.

16. The electronic device of claim 10, wherein the air-diverting structure extends a partial depth of the gap.

17. A method of cooling an electronic device with a cooling module, the electronic device comprising a first heat-generating component and a second heat-generating component, the method comprising: in the cooling module, generating a flow of air through an airflow channel via a blower, the airflow channel comprising a heat sink extending into the airflow channel, the heat sink being in thermal communication with the first heat-generating component and moveable relative to a body of the blower via a gasket connecting the heat sink to the body of the blower; directing a first portion of the flow of air in the airflow channel through a plurality of fins of the heat sink toward a first outlet; and directing a second portion of the flow of air in the airflow channel through a gap between a distal surface of the heat sink and an opposing interior surface of the body of the blower such that the second portion of the flow of air is redirected toward a second outlet via an air-diverting structure in the gap.

18. The method of claim 17, wherein directing the second portion of the flow of air in the airflow channel through the gap further comprises directing the second portion toward a curved wall of the air-diverting structure.

19. The method of claim 17, wherein directing the second portion of the flow of air in the airflow channel comprises redirecting the second portion of the flow of air in a direction transverse to the first portion.

* * * * *